US005538527A

United States Patent [19]

Viret et al.

[11] Patent Number: 5,538,527

[45] Date of Patent: Jul. 23, 1996

[54] METHOD OF SEALING GLASS TO ALUMINUM, PARTICULARLY FOR ELECTRICAL FEED-THROUGH CONNECTORS

[75] Inventors: Paul Viret, Marly Le Roi; Bernard Ledain, Plaisir, both of France

[73] Assignee: Dassault Electronique, Saint-Cloud, France

[21] Appl. No.: 257,960

[22] Filed: Jun. 10, 1994

Related U.S. Application Data

[63] Continuation of Ser. No. 969,107, Oct. 30, 1992, abandoned, which is a continuation of Ser. No. 467,663, Jan. 19, 1990, abandoned.

[30] Foreign Application Priority Data

Jan. 20, 1989 [FR] France .................................. 89 00709

[51] Int. Cl.$^{6}$ .......................... C03C 27/04; C03C 17/23; H01L 23/02

[52] U.S. Cl. ............................ 65/43; 65/59.31; 65/59.4; 65/59.5; 65/59.6; 65/60.5; 174/52.4

[58] Field of Search .............................. 65/42, 43, 59.31, 65/59.4, 59.5, 33, 33.5, 33.6, 59.6, 60.5, 45, 47, 48, 49, 59.1, 66; 156/89; 403/179, 404; 501/45, 47, 48, 153

[56] References Cited

U.S. PATENT DOCUMENTS

| | | | |
|---|---|---|---|
| 4,202,700 | 5/1980 | Wilder, Jr. | 106/39.6 |
| 4,309,507 | 1/1982 | Davis et al. | 501/21 |
| 4,349,635 | 9/1982 | Davis et al. | 501/15 |
| 4,349,692 | 9/1982 | Davis et al. | 65/59.31 |
| 4,411,680 | 10/1983 | Kyle | 65/33.6 |
| 4,421,947 | 12/1983 | Kyle | 65/33.5 |
| 4,455,384 | 6/1984 | Day et al. | 501/15 |
| 4,678,358 | 7/1987 | Layher | 403/28 |
| 4,713,580 | 12/1987 | Schoene | 445/26 |
| 4,761,518 | 8/1988 | Butt et al. | 437/217 |
| 4,882,212 | 11/1989 | SinghDeo et al. | 501/32 |
| 4,915,719 | 4/1990 | Saffari | 65/59.27 |
| 4,939,316 | 7/1990 | Mahulikar et al. | 174/52.4 |

FOREIGN PATENT DOCUMENTS

| | | |
|---|---|---|
| 0100817 | 2/1984 | European Pat. Off. . |
| 0287722 | 10/1988 | European Pat. Off. . |
| 57-08273 | 1/1982 | Japan . |
| 58-98939 | 6/1983 | Japan . |
| 60-116156 | 6/1985 | Japan . |
| 63-144551 | 6/1988 | Japan . |
| 699492 | 11/1953 | United Kingdom . |

OTHER PUBLICATIONS

Japan Abstract, vol. 9, No. 270 (E-353) (1993) Oct. 26, 1985.

*Primary Examiner*—Donald E. Czaja
*Assistant Examiner*—Steven P. Griffin
*Attorney, Agent, or Firm*—Christie, Parker & Hale

[57] ABSTRACT

An insulating electrical feed-through connector extending through a wall of aluminium is obtained by using a sintered sleeve comprising phosphate glass in which a conductive pin is inserted. The sleeve is raised to a firing temperature in excess of the dilatometric softening temperature of the vitreous material in the presence of a first effective quantity of alumina between the sleeve and the wall and of a second effective quantity of nickel oxide between the sleeve and the pin, which makes it possible to achieve a simultaneous and direct hermetic sealing of the sleeve to the wall and of the pin to the sleeve.

78 Claims, 8 Drawing Sheets

METHOD OF SEALING GLASS TO ALUMINUM, PARTICULARLY FOR ELECTRICAL FEED-THROUGH CONNECTORS

CROSS-REFERENCE TO RELATED APPLICATIONS

This application is a continuation of Ser. No. 07/969,107, filed Oct. 30, 1992, now abandoned, which is a continuation of Ser. No. 07/467,663, filed Jan. 19, 1990, now abandoned.

Further related applications are 08/177,206, filed Jan. 4, 1994, now U.S. Pat. No. 5,367,125, which is a continuation of Ser. No. 07/862,602, filed Apr. 1, 1992, now abandoned, which is a continuation of Ser. No. 07/562,756, filed Aug. 3, 1990, now abandoned, which is a division of Ser. No. 07/467,663, filed Jan. 19, 1990, now abandoned.

BACKGROUND OF THE INVENTION

The invention relates to the sealing of a vitreous material onto a material containing aluminium, One particularly worthwhile application of such seals resides in the production of electrical functional boxes which contain at least one hybrid electronic circuit, commonly referred to as "hybrid boxes". However, the invention is not confined to this particular application.

Beside monolithic integrated circuits, hybrid electronic circuits are used, being more briefly known as "hybrid circuits". Their name originates from the fact that they comprise monolithic integrated circuit chips on a ceramic substrate, the chips being associated with discrete components and links produced by metallic deposition on the ceramic material.

For certain applications,.the hybrid circuits used in sub-units are combined in one hybrid box. Such a box generally has a bottom, a lid and a plurality of electrical feed-through connectors situated on at least one of these walls. In certain cases, there must be hermetic seals both with regard to the connection between the bottom and the lid and with regard to the electrical feed-through connectors.

Currently known are such boxes which consist of an iron-nickel-cobalt alloy-based material which is known particularly by the trade mark KOVAR of WESTINGHOUSE CORPORATION. Each electrical feed-through connector comprises a conductive pin generally of KOVAR hermetically fixed in a passage in the wall by a glass-to-metal seal which is well known to a man skilled in the art. The connection between the lid and the bottom is achieved by a conventional electrical weld.

A "macrohybrid" box is a large hybrid box and producing it in KOVAR material by the aforesaid technique has two major drawbacks when such boxes are used inside computers which are mounted in an aircraft.

The first of these drawbacks is linked to the density of the KOVAR which means that the macrohybrid box has a high mass which becomes a serious disadvantage in the aforementioned use, the weight factor being particularly important in aeronautics.

The second drawback is connected to the poor heat conductivity of KOVAR. By virtue of its size, a macrohybrid box generally contains a very large number of hybrid circuits (or one very large hybrid circuit) which, in operation, give off calorific energy which is normally dissipated through the body of the box. This poor thermal conductivity of KOVAR interferes with satisfactory thermal dissipation and may therefore give rise to poor-quality functioning, or even result in breakdowns.

It has been found that the use of a aluminium containing material makes it possible to offset the two aforementioned disadvantages.

However, such use gives rise to considerable technical problems with regard to the production of a glass-to-aluminium seal, particularly by reason of the opposing physical properties (particularly the melting point and the coefficient of expansion) of these two materials. A man skilled in the art knows indeed that the melting point of a conventional glass is generally higher than 1000° C. while the melting point of aluminium is about 550° C. Furthermore, the coefficient of expansion of aluminium is generally higher than that of conventional glasses. The extent of these problems is further enhanced by the need to obtain a hermetic seal such as that normally required for macrohybrid boxes.

Therefore, the main object of the present invention is to provide a solution to this problem.

SUMMARY OF THE INVENTION

One object of the invention is to permit a direct sealing of a vitreous material onto a material containing aluminium.

The invention relates to a composite member of the type comprising a wall and an insert mounted in a seating in the wall. The term "seating" as used herein, and as shown in the accompanying drawings, refers to an opening in the aluminum body.

According to a general characteristic feature of the invention, the wall consists of an aluminium based material and the insert comprises, at least on its periphery, a vitreous material which is directly sealed onto at least one portion of the interior surface of the seating in the wall.

This member may, for example, be an element of a macrohybrid box or it may be a complete macrohybrid box comprising a bottom which is hermetically closed by at least one cover or lid. The insert may likewise comprise a metallic element which is directly sealed onto the heart of the vitreous material. This metallic element may, for example, be a conductive pin traversing the vitreous material from one side to the other in such a way as to form an electrical feed-through connector which is mounted in the wall.

To ensure that the seal is effective, it is advantageous for the insert to comprise a first effective quantity of a first metallic oxide situated in the vicinity of the wall of the seating. Adjustment of the thickness of this layer of oxide likewise influences the sealing-tightness of the seal.

Similarly, when the insert also contains a metallic element i.e., metallic member within it, it is advantageous for it likewise to comprise a second effective quantity of a second metallic oxide situated in the vicinity of this metallic element. Thus, better adhesion of this metallic element in the vitreous material is ensured and adjusting this quantity of oxide likewise affects the sealing-tightness of the seal.

The invention likewise relates to a method of implanting at least one insert into at least one seating in a wall consisting of a material containing aluminium.

According to a general feature of the invention, this method comprises the following stages:

a) preparation of the seating in the wall;

b) preparation of the insert, which comprises at least on its periphery a sintered element which can be inserted into the said seating; this sintered element is obtained from a powder of a vitreous material compatible with the material of the wall;

c) introduction of the insert into the seating;

d) raising of the insert to a firing temperature which is higher than the dilatometric softening temperature of the said powder in the presence of a first effective quantity of a first metallic oxide between the vitreous element and the wall.

Thus, a direct sealing of the insert on the wall is obtained.

Thus, in accordance with a preferred embodiment of the invention, there is provided a method of implanting at least one insert into an opening in a body of aluminum or aluminum alloy comprising:

providing a body of aluminum or aluminum alloy having at least one opening therein;

oxidizing the surface of said body surrounding said opening to produce a coating of aluminum oxide of a thickness of 0.5 to 10 microns;

preparing an insert of powdered vitreous material sintered on at least the outer surface thereof, said vitreous material comprising approximately 20% to 50% by moles of $Na_2O$, approximately 5% to 30% by moles of BaO, approximately 0.5% to 3% by moles of $Al_2O_3$ and approximately 40% to 60% by moles of $P_2O_5$;

inserting said vitreous insert into said opening in said body; and heating said insert to a firing temperature greater than the dilatometric softening temperature of said powdered vitreous material to seal the insert to body.

In accordance with another preferred embodiment of the invention there is provided a method of implanting at least one insert with a metallic element into an opening in a body of aluminum or aluminum alloy comprising:

providing a body of aluminum or aluminum alloy having at least one opening therein;

oxidizing the surface of said body surrounding said opening to produce a coating of aluminum oxide of a thickness of 0.5 to 10 microns;

preparing an insert in the form of a hollow sleeve of powdered vitreous material sintered on at least the outer surface thereof, said vitreous material comprising approximately 20% to 50% by moles $Na_2O$, approximately 5% to 30% by moles BaO, approximately 0.5% to 3% by moles $Al_2O_3$ and approximately 40% to 60% by moles $P_2O_5$;

providing a metallic element sized to be insertable into the hollow sleeve;

depositing a filler material on the surface of the metallic element on at least the portion thereof to be inserted into said hollow sleeve;

oxidizing the surface of said filler metal;

inserting said metallic element into said sleeve and inserting said sleeve into said opening in said body; and heating said sleeve to a firing temperature greater than the dilatometric softening temperature of said powdered vitreous material to seal the sleeve to the body and the element to the sleeve.

At this juncture, it should be remembered that the dilatometric softening temperature of a vitreous material is a temperature at which this material has a viscosity of $10^{11.3}$ poises. Thus, the idea of compatibility between the vitreous material and the material of the wall in this case particularly relates to the relationship between the dilatometric softening temperature of this vitreous material and the melting temperature of the material of the wall. It likewise relates in particular to the comparison of the respective expansion coefficient of these two materials.

In one form of embodiment, stage b) comprises a sub-stage b1) in which the vitreous element of the insert is formed from the said powder in the presence of a binder which is mixed with it; this sub-stage b1) is followed by a sub-stage in which this formed vitreous element is sintered.

In a particular application, the seating may be a passage through the wall and the insert may then comprise a metallic element such as a pin which passes through the insert from one side to the other, which makes it possible to obtain an electric feed-through connector. This wall may be an element of a macrohybrid box. In this case, it is advantageous for the method furthermore to comprise a stage in which a laser welds the lid of the box to the bottom of the box.

The invention further relates to the glass composition as a means capable of permitting the implantation method according to the invention to be carried out, this composition being likewise that of the vitreous element of an insert of a composite article according to the invention.

Further advantages and characteristic features of the invention will become apparent from examination of the detailed description given hereinafter and from the appended drawings.

DETAILED DESCRIPTION OF THE PREFERRED EMBODIMENTS

Figure 1:
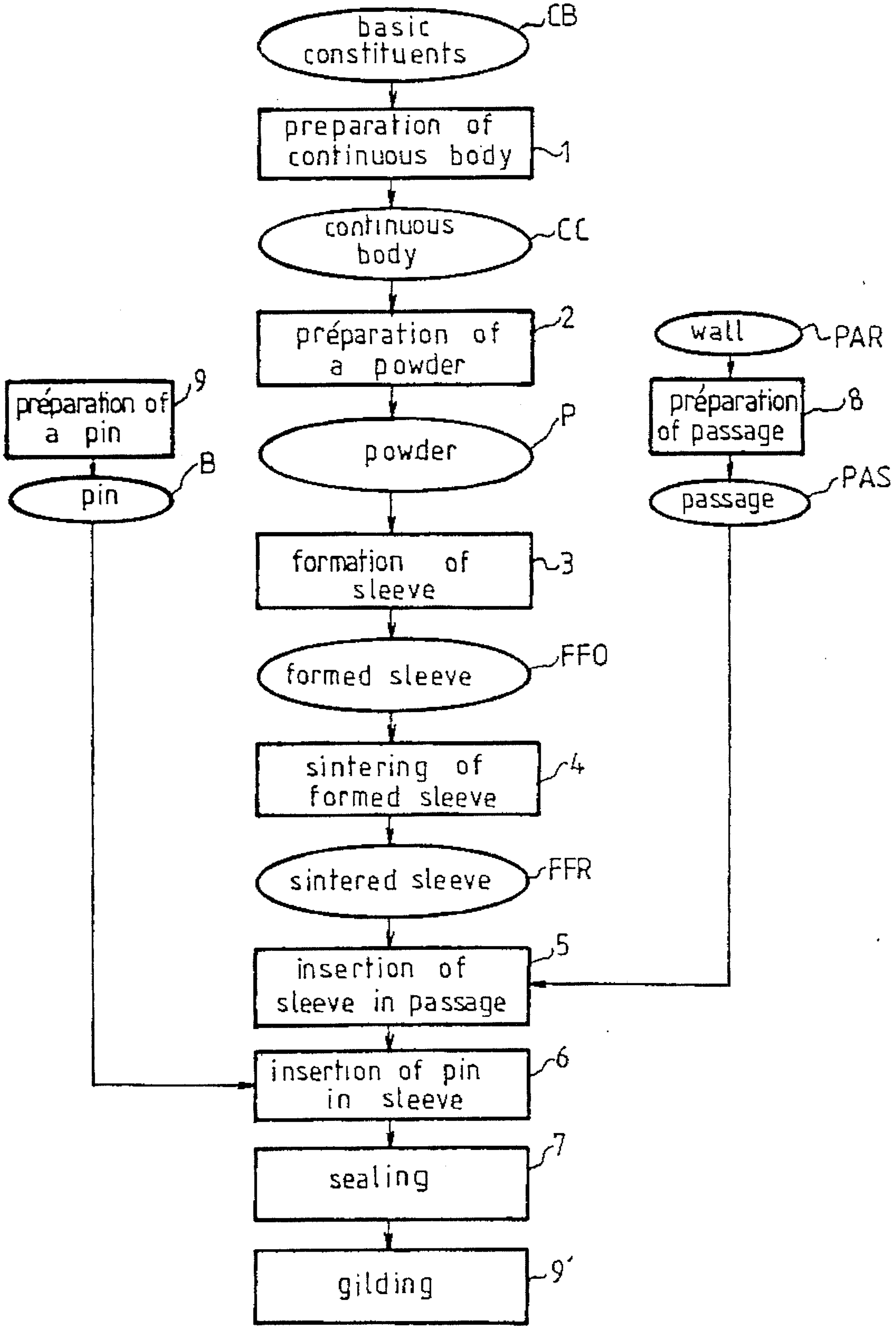
FIG. 1 is a general flow chart of an embodiment of the method according to the invention which makes it possible to produce an electrical feed-through connector.

Essentially, the drawings show elements of a certain nature and form an integral part of the description. Under this heading, they may serve not only as an aid to the understanding of the detailed description which follows but may also, as applicable, contribute to the definition of the invention.

The production of a composite object which comprises a vitreous material directly sealed onto an aluminium based wall requires inter alia a suitable choice of this vitreous material. For such a seal, preferably phosphate glass is used, that Is to say a glass which is based on phosphate, in contrast to certain other types of glass, particularly those which are based on lead or silica (used in conventional glass-KOVAR sealing). Furthermore, a phosphate glass is not a "glass" in the strict sense of the word but is, in fact, a partially crystalline ceramic glass. Nevertheless, it will be referred to here as "phosphate glass" in keeping with general usage.

Families of phosphate glass are described in U.S. Pat. Nos. 4,202,700 and 4,455,384. Among these, not all are suitable for preparing a seal on an aluminium alloy which can be industrially produced with a satisfactory level of reproducibility. After numerous tests, the Applicants have found that it was possible to use, especially for this purpose, a phosphate glass of the following composition:

- between approx. 20% and approx. 50% in terms of moles of sodium oxide ($Na_2O$),
- between approx. 5% and approx. 30% in terms of moles of Barium oxide (BaO),
- between approx. 0.5% and approx. 3% in terms of moles of alumina ($Al_2O_3$),
- between approx. 40% and approx. 60% in terms of moles of phosphoric anhydride ($P_2O_5$).

The Applicants have noted it was preferable to add to the phosphate glass a crystallization modifying agent, such as aluminum nitride (AlN) in a quantity of less than about 7%. The reasons for this addition will be explained hereinafter.

In addition to these composition characteristics, the vitreous material must have a dilatometric softening temperature and an expansion coefficient which are compatible respectively with the melting temperature and the expansion coefficient of the aluminium. Therefore, a vitreous material will be chosen which has a dilatometric softening temperature of between 300° C. and about 550° C. and an expansion coefficient between about 10 and 25 ppm/°C. (the notation °C. denotes degrees Celsius and the notation ppm denotes parts per million).

Generally speaking, the implanting of an insert in a seating in a wall requires, prior to sealing, a stage a) of preparation of the seating and a stage b) of preparation of the insert; these two stages may be carried out independently of each other in any order.

The insert comprises on its periphery a sintered vitreous element obtained from a powder of a vitreous material of the same type as those mentioned hereinabove. This powder may, for instance, result from the grinding of a continuous body.

Stage b) of preparing such a vitreous element consists first of all in shaping it in a sub-stage b1), from the powder which is mixed with a binder. Then, after the binder is removed, the vitreous element is sintered in a sub-stage b2). The object of this sintering is to "glue" the grains of glass to one another in order to obtain an insert of a consistency and cohesion which allow easy handling compatible with an industrial process.

In the case of the preparation of an electrical feed-through connector as defined in FIG. 1, the sintered peripheral element of the insert is a sleeve FFR.

Figure 2:
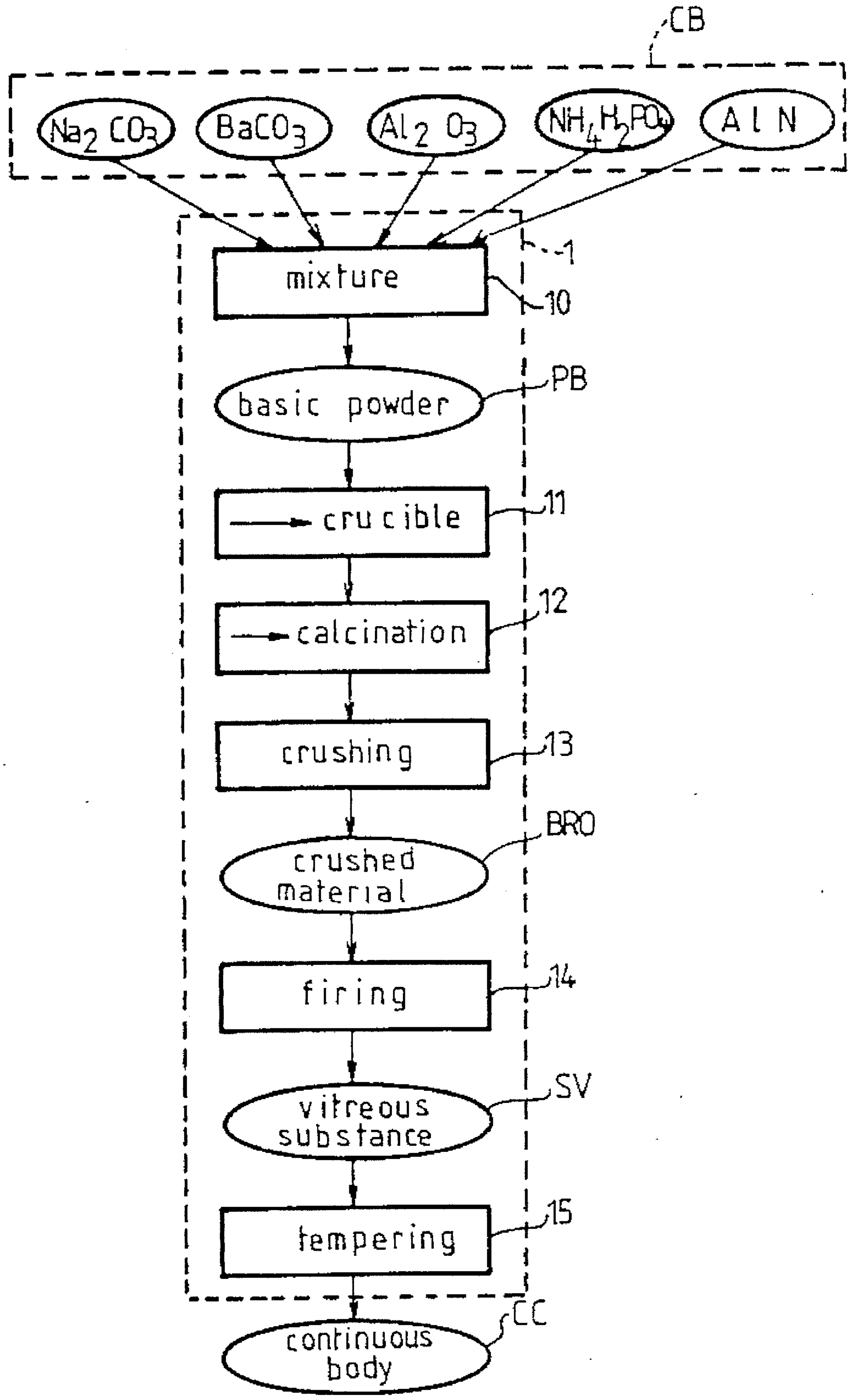
FIGS. 2 to 4 show in a more detailed way different stages in the flow chart in FIG. 1.

The powder P is obtained from a continuous body CC obtained in a sub-stage 1 comprising the sequence of operations shown in FIG. 2.

An intimate mixture (operation 10) of various powders of basic constituents CB is prepared in order to obtain a basic powder PB. To produce this basic powder, 42.4 g sodium carbonate ($Na_2CO_3$), 19.74 g barium carbonate ($B_aCO_3$), 1.02 g alumina ($Al_2O_3$), 112.73 g ammonium hydrogenophosphate ($NH_4H_2PO_4$) and 1.76 g aluminium nitride (AlN) are used.

The basic powder thus obtained is placed in an alumina crucible (operation 11) and is then calcined at 300° for 12 hours (operation 12) to eliminate the ammonia and the water. The calcined product is then crushed (operation 13), after which the crushed product BRO (operation 14) is cooked to obtain a vitreous substance SV. This cooking process 14 comprises raising the temperature for about one hour at the rate of 750° C. per hour until a temperature of 750° C. is reached, after which this temperature is maintained for 2 hours. The vitreous substance then undergoes a heat tempering stage by being poured over a sheet of KOVAR or stainless steel at 200° C. (operation 15). Then the continuous body CC is obtained which contains approx. 38.35% by moles of $Na_2O$, 9.59% moles BaO, 0.96% moles $Al_2O_3$, 46.98% moles $P_2O_5$ and 4.12% moles AlN.

Such a vitreous material then has a dilatometric softening temperature of approx. 330° C., an expansion coefficient of approx. 20 ppm/°C. and its melting temperature is approx. 600° C.

Figure 3:
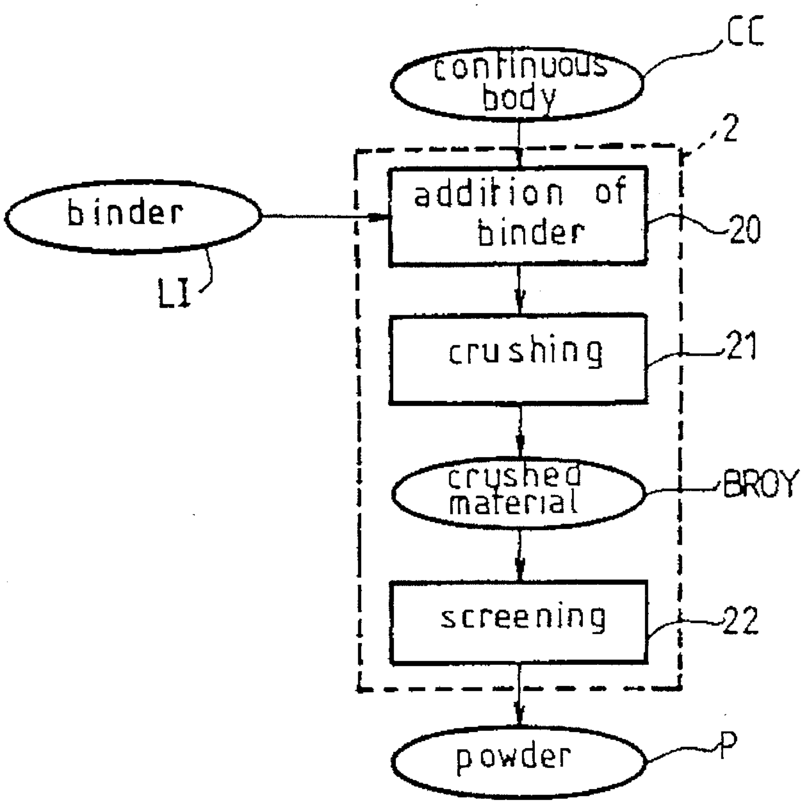

The powder P is then obtained from the continuous body CC in a sub-stage 2 illustrated in detail in FIG. 3.

A binder LI possibly containing a polycarbonated compound with a chain length of at least 1500 and at most 6000 atoms is added to the continuous body CC (operation 20). In the example described, the polycarbonated compound is polyethylene glycol 4000, which therefore by definition has a chain length equal to 4000. Its quantity is 3% by weight. The resultant mixture is crushed for about 5 minutes in a hammer mill (operation 21). The crushed material BROY thus obtained is then screened (operation 22) to obtain the said powder P. By virtue of its passing through a screen, this powder has a granulation of between 75 and 106 microns.

Although the screening operation is not absolutely necessary, obtaining a powder of a given granulation facilitates the subsequent stages of the method. It is generally appropriate for this granulation to be in excess of about 5 microns. Its upper limit is chosen according to the desired size of the vitreous element of the insert.

Figure 4:
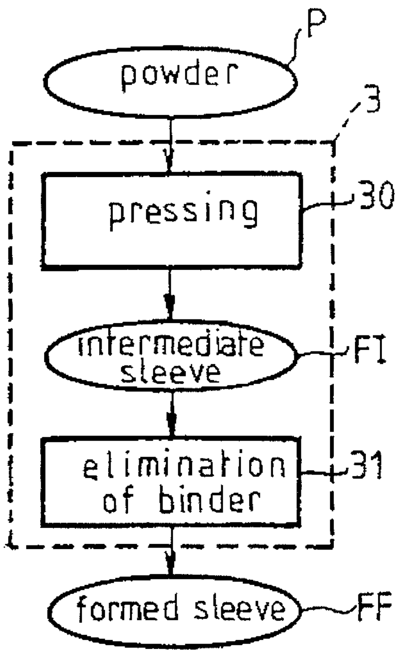

Sub-stage b1) of the formation of the sleeve is identified by reference numeral 3 and is shown in detail in FIG. 4.

The operation 30 consists of introducing into a pressing mould, which is of a shape matching that of the sleeve which is to be obtained, a quantity of powder chosen with an eye to the geometry of the sleeve. In particular, this mould comprises a rod which makes it possible to produce a central passage through the sleeve.

After this powder has been compressed at a sufficient pressure, having regard to the desired density of the sleeve, an intermediate sleeve FI is obtained. It should be pointed out here that it is important to use an organic binder having a chain length in excess of 1500 in order to ensure satisfactory cohesion within the intermediate sleeve.

This organic binder is then eliminated from the intermediate sleeve by an oven-drying stage 31 which in this embodiment is carried out at 200° C. for 12 hours. The binder is thus evacuated from the interior of the intermediate sleeve and migrates towards the outside. The result is a shaped sleeve FF.

At this juncture, it is as well to point out that a polycarbonated binder having a chain length in excess of 6000 would be very difficult to eliminate.

In an alternative embodiment, it could be envisaged that stage 2 of obtaining the powder P need not include the addition of binder, this latter only coming in at stage 3 in the production of the shaped sleeve FF, prior to the pressing operation 30. However, in this case, it would be advisable separately to grind the binder LI before it is incorporated into the powder P.

Time sintering sub-stage b2) (reference 4) is generally carried out at a temperature in the immediate vicinity of the dilatometric softening temperature of the vitreous material, that is to say at a temperature at which the material starts to soften without changing shape. For the composition of glass described hereinabove, sintering of the formed sleeve F (reference 4) is carried out in a PYREX cupel according to a temperature gradient of 20° C./min until a temperature of 335° C. is reached.

Figure 5:
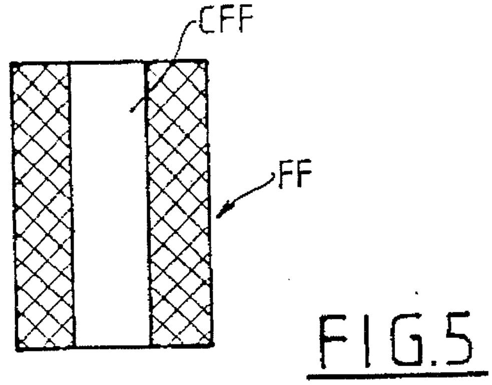
FIG. 5 diagrammatically shows a sintered sleeve obtained by the method according to the invention.

Such a sintered sleeve FF is shown in FIG. 5. It consists of a cylinder approx. 1.9 mm in length and which is traversed lengthwise, from end to end, by a central passage CFF. The outside diameter of this cylinder is approx. 1.3 mm while the diameter of the passage is approx. 0.6 min.

Of course, the various dimensions indicated here and those indicated hereinafter are given solely by way of non-limitative examples.

Figure 6:
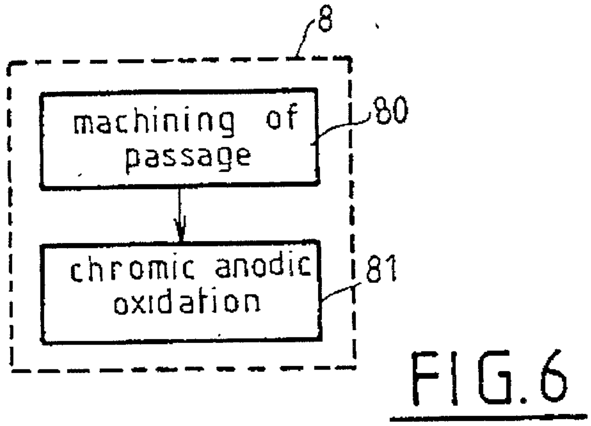
FIG. 6 shows a stage in the production of a passage.
Figure 7:
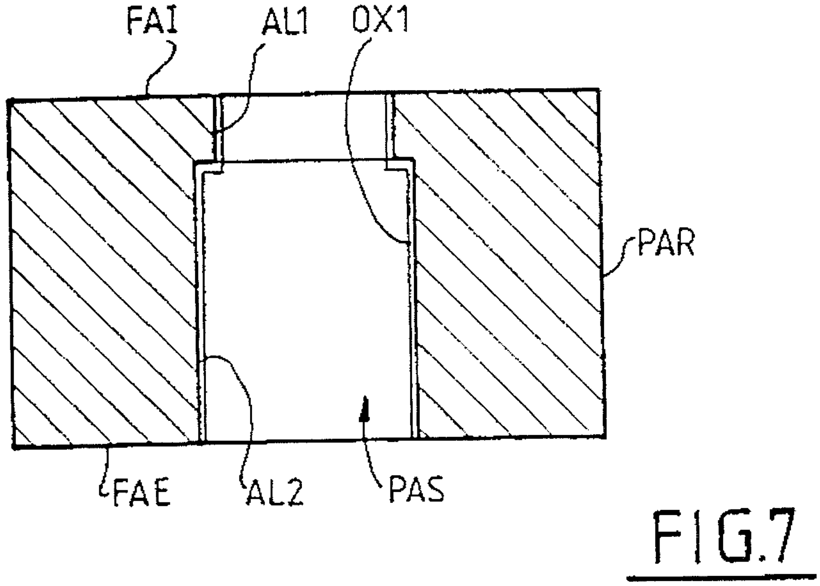
FIG. 7 illustrates a passage which is thus obtained.

The seating intended to receive the insert may be variously configured according to the intended applications. In the present case, which relates to the preparation of an electrical feed-through connector, the seating is a passage through the wall. Stage a) in the preparation of this passage is identified by reference numeral 8 and is shown in FIG. 6. The passage obtained is shown in FIG. 7.

In the wall PAR, machining 80 is carried out to produce the passage. From the inner face FAI of the wall towards the outer face FAE, it comprises two boring operations AL1, AL2. In this embodiment, the lengths of the bores AL1 and AL2 are respectively around 0.50 mm and 2.50 mm. Their respective diameters are around 1.22 mm and 1.35 mm.

The material of the wall PAR is an aluminium alloy referred to as "5086" in the respective French standard. Its melting temperature is between 580° C. and 640° C. and its expansion coefficient is 23.55 ppm/°C. Its composition is as follows:

approx. 4% by weight magnesium approx. 0.5% by weight manganese approx. 95.5% by weight aluminium.

It should be noted here that aluminium and all its alloys are suitable for sealing glass on metal by the method according to the invention.

Following the machining of the passage, the wall is plunged into a chrome acid bath to undergo chromic anodic oxidation 81. Then, a layer of alumina is deposited on the edges of the passage PAS and the thickness of this layer can be adjusted between about 1 micron and about 1.5 microns. Adjusting the thickness of the layer of this first metallic oxide OX1 is important to the characteristic features of the seal and the usefulness of depositing such a layer will be dealt with in greater detail hereinafter.

Figure 8:
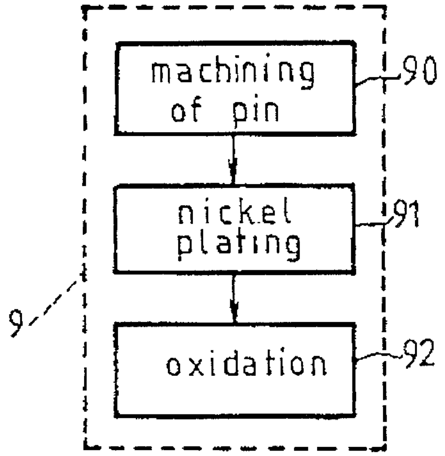
FIG. 8 illustrates a stage in the production of a pin.
Figure 9:
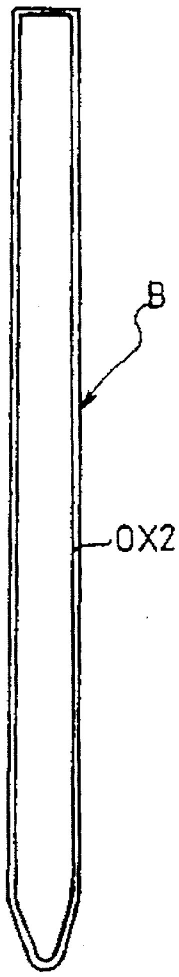
FIG. 9 illustrates a pin which is thus obtained.

This passage PAS is designed to receive a conductive pin B shown in FIG. 9, the preparation stage 9 of which is shown in FIG. 8.

From a metallic alloy of copper and beryllium of the following composition:

Beryllium (Be): between about 1.8% and about 2% by weight

Cobalt (Co): between about 0.2% and about 0.3% by weight

Lead (Pb): between about 0.2% and about 0.6% by weight

Nickel (Ni): about 0.05% by weight

Copper (Cu): balance to make up 100% by weight, a pin B in the form of an elongated cylinder approx. 9.75 mm long is machined and has one end extended by a truncated cone rounded off to have at the apex an angle of approx. 30°. Such a pin has an expansion coefficient of 17.4 ppm/°C. and an electrical conductivity of $2.5.10^{-6}$ Ohms/cm. Generally, metallic materials will be used which have an expansion coefficient between approx. 15 and approx. 20 ppm per °C. and an electrical conductivity of between about $2.10^{-6}$ and approx. $10.10^{-6}$ Ohms/cm.

This pin B will then undergo nickel plating 91 consisting of the deposition of a coating of nickel approx. 5 microns thick. This nickel plating is followed by oxidation in air for 15 minutes in an oven at 490° C. The pin B is then, when it emerges from this oxidation stage, covered with nickel oxide OX2. The presence of this second metallic oxide OX2 is likewise important to the satisfactory stability of the pin at the heart of the insert and its usefulness will be explained hereinafter.

Figure 10:
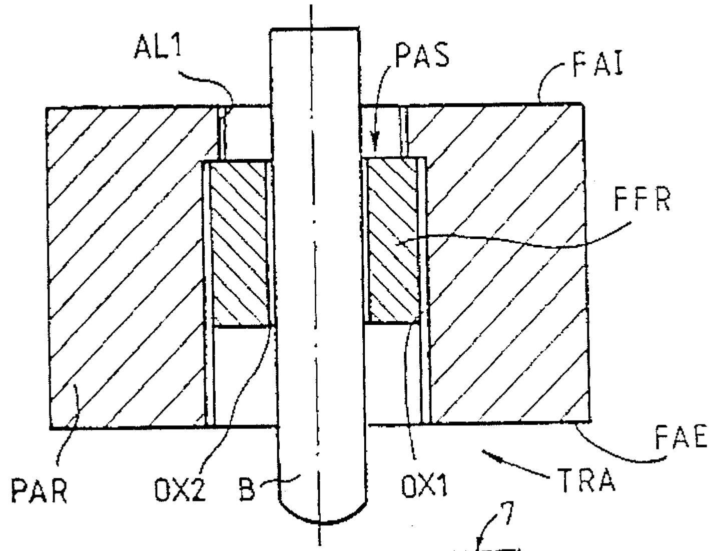
FIG. 10 diagrammatically shows an electrical feed-through connector prior to sealing.

As all the elements of which the feed-through connector consists are now produced, it is possible to proceed with insertion of the sintered sleeve in the passage and then insertion of the pin in the sleeve. Thus, an electrical feed-through connector TRA is obtained prior to sealing, and this is shown in FIG. 10. The sintered sleeve FFR is situated in the bore AL2 and bears against the bore AL1. The pin B is maintained at the chosen distance within the sleeve by a centering tool not shown in this FIG. 10. In the embodiment described in the rounded end of the pin is situated on the same side as the outer face of the wall PAR.

Although this insertion sequence may be advantageous, particularly for centering of the pin, it could equally well be reversed, that is to say the pin could be inserted into the sleeve and then the whole inserted into the passage.

Figure 11:
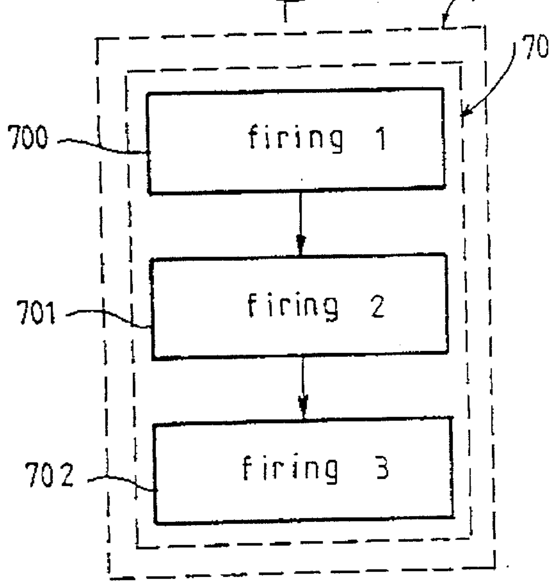
FIG. 11 shows a flow chart of a stage in the sealing process.

The assembly which is thus constituted is conveyed to a furnace so that the electrical feed-through connector can be duly sealed 7 (FIG. 11).

The sealing stage according to the invention is carried out under a neutral atmosphere, particularly an atmosphere of nitrogen, the firing temperature being raised above the dilatometric softening temperature of the vitreous material constituting the sintered sleeve in accordance with a selected temperature profile. In this embodiment, the temperature is first raised in steps of 12° C. per minute (operation 700) followed by a levelling out at a firing temperature equal to 450° C. for 50 minutes (operation 701), followed by a temperature drop from this level and at the rate of 12° C. per minute (operation 702).

This firing is therefore carried out in the presence of the first metallic oxide between the sintered sleeve and the wall and in the presence of the second metallic oxide between the sleeve and the conductive pin.

The presence of alumina between the sleeve and the wall makes it possible to ensure the stability of the seal thus obtained by the interpenetration of the oxygen atoms in the alumina with the oxygen atoms belonging to the various oxides of the vitreous material. Adjusting the thickness of the alumina coating which therefore induces a first effective quantity of this first metallic oxide, plays an important role not only in the stability of the seal but also in its sealing-tightness. A thickness between approx. 1 and approx. 1.5 microns makes it possible in particular to obtain a so-called "hermetically sealed" vitreous material. The sealing-tightness is then less than or equal to $10^9$ cu.cm.$s^{-1}$ of helium for a 1 atmosphere pressure difference on either side of a seal with a unitary surface area of 1 sq.cm.

If the alumina coating is thicker, this sealing-tightness decreases until a porous seal is possibly obtained at the level of the wall if the coating is too thick. Generally, it is considered that an effective quantity of the first metallic oxide is a quantity which makes it possible to obtain a seal of a stability and sealing-tightness which are compatible with the envisaged application.

Thus, whatever the application, the Applicants have noted that a thickness of oxide of less than 0.5 microns approx.

does not make it possible to achieve a mechanical grip of the glass on the aluminium. Similarly, although the maximum thickness of oxide depends on the desired sealing-tightness and stability, it is preferable not to exceed 10 microns.

The presence of an effective quantity of nickel oxide between the pin and the vitreous material helps to ensure satisfactory adhesion of these two bodies by interpenetration of the oxygen atoms in the nickel oxide with those of the various glass oxides. The 5 micron coating of nickel deposited on the pin, after oxidation, produces a thickness of nickel oxide (about 3 microns) which helps to ensure an hermetic seal. Generally, the Applicants have noted that a thickness of nickel oxide of between about 2 and about 5 microns makes it possible to achieve the sealing-tightness indicated above.

Figure 12:
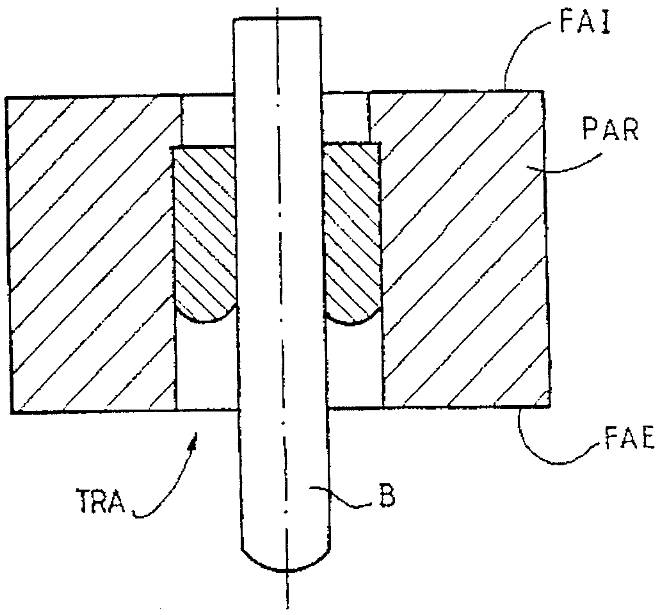
FIG. 12 diagrammatically shows an electrical feed-through connector after sealing.

When the seal is being made, the sintered sleeve adopts the form of the geometry of the passage, which makes it possible to obtain a direct and simultaneous seal, that is to say one which does not require any contribution of external material, of the pin to the sleeve and of the sleeve to the wall. This hermetic and electrically insulating seal makes it possible to obtain the electrical feed-through connector required (FIG. 12).

Figure 13:
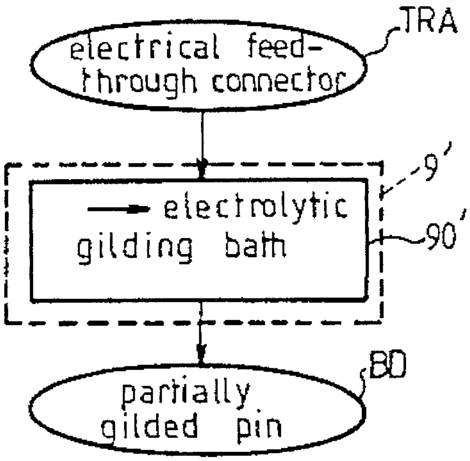
FIG. 13 shows a stage in the additional processing of a pin.

For certain applications, it ,nay be necessary to carry out an additional gilding process 9' on the pins, as shown in FIG. 13. This gilding makes it possible to obtain a partially gold-plated pin BD, that is to say a pin which is gilded only on its inner and outer parts which are situated outside the vitreous sealing material. In order to carry out such a treatment, it is appropriate to plunge the whole into an electrolytic gilding bath (operation 90'). The Applicants have noted that the use of phosphate glass did not call for protection of the seal prior to its immersion in the gilding bath. On the other hand, if the vitreous material did not contain any crystallisation modifying agent, they observed that it would be as well to protect the seal, for example by means of an epoxy resin film before immersing the whole in the gilding bath because otherwise the acid nature of the bath would result in a more or less substantial deterioration of the vitreous material of the seal.

However, this is not the only reason for adding a crystallisation modifying agent. Indeed, such an agent does impart better mechanical properties to the seal, better stability under environmental conditions and a longer effective life.

However, if the quantity of aluminium nitride exceeds. The effective quantity of 7% by moles, the melting temperature of the aluminium alloy turns out to be less than the dilatometric softening temperature of the vitreous material, which of course is inappropriate in the applications according to the invention.

It is likewise possible to choose as a crystallisation modifying agent platinum (Pt) in an effective quantity of less than 0.5% by moles. In this case, instead of aluminium nitride, platinum tetrachloride ($PtCl_4$) is added to the basic constituents. In this case, stage 7 of the sealing process would, following the firing operation 70, include an annealing of the seal in order to ensure crystal growth. The gilding treatment of the pins is then carried out after the annealing process.

Figures 14A, 14B:
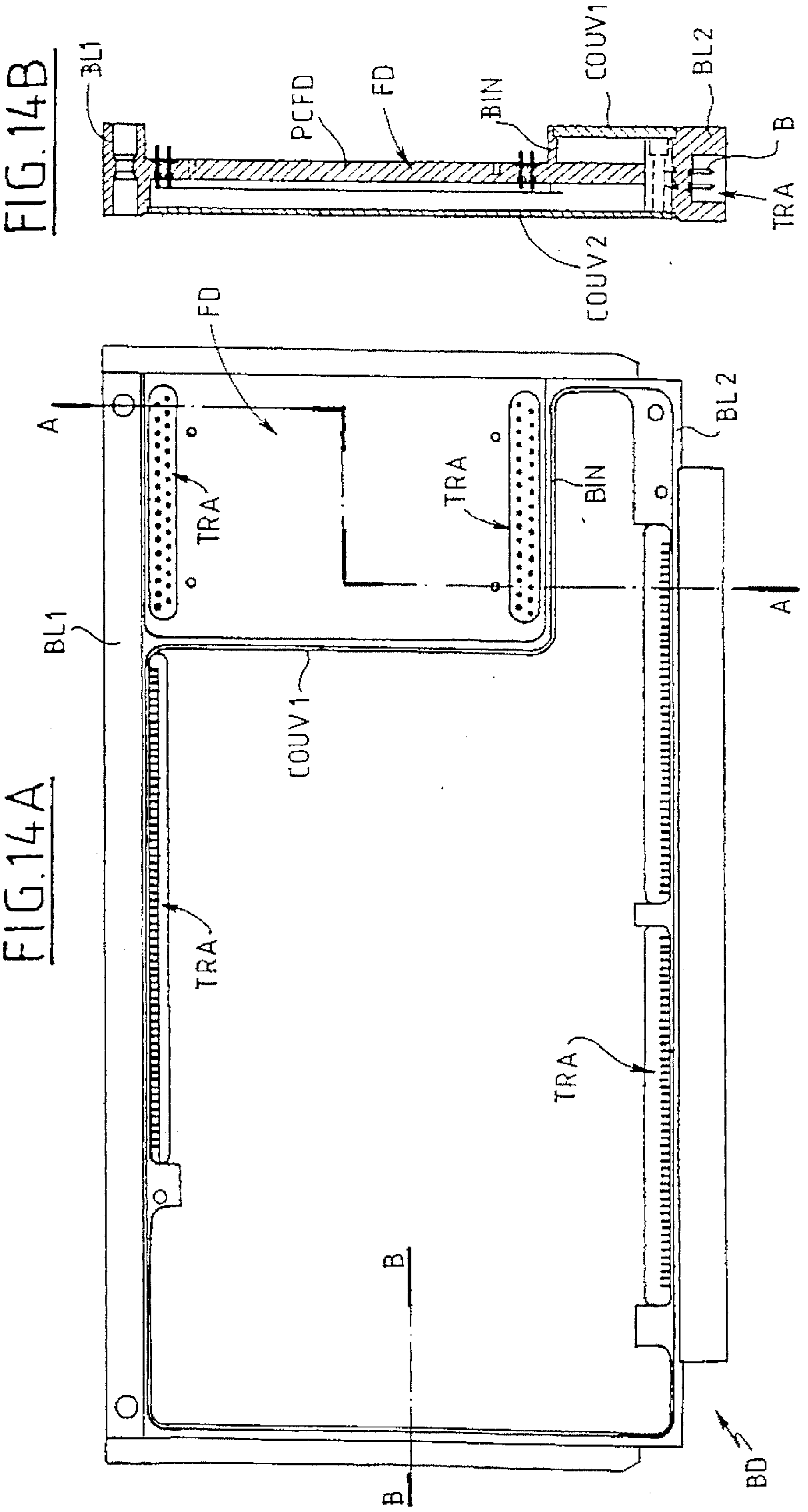
FIGS. 14A to 14C show an embodiment of a macrohybrid box.
Figure 14C:
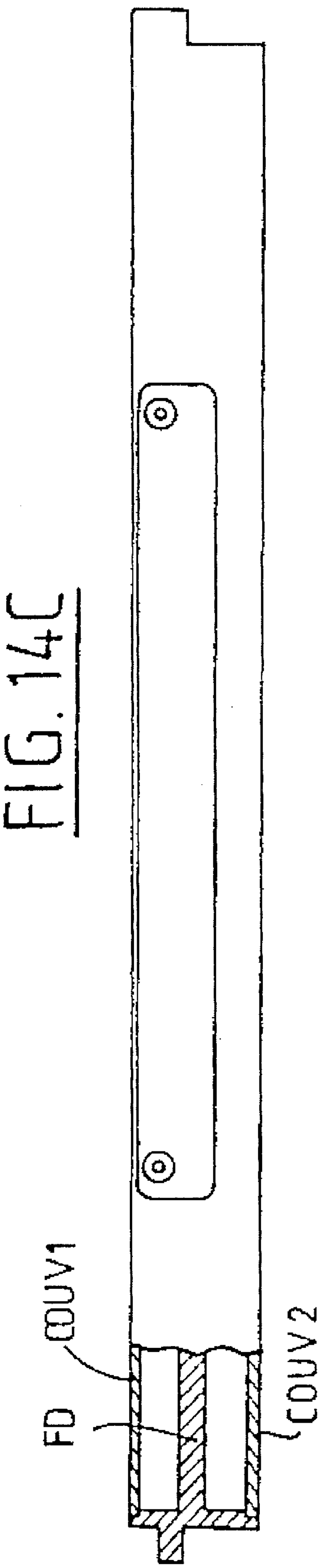

An embodiment of a macrohybrid box comprising a plurality of electrical feed-through connectors will now be described hereinafter, reference being made to FIGS. 12 and 14A to 14C. FIGS. 14A to 14C are arranged in accordance with the conventions of French industrial drawings, FIG. 14B being more particularly the section AA in FIG. 14A, while FIG. 14C partially comprises the section BB in FIG. 14A.

The box 80 is substantially rectangular having a length of approx. 70 mm and a width of approx. 50 mm. This box comprises a bottom FD having two lateral edges BL1 and BL2 and a central part PCFD extending in the longitudinal direction of the box between two lateral edges. An intermediate edge BIN is provided in a region of the central part PCFD. This edge extends substantially at right-angles to the lateral edge BL1 and is then folded over at a right-angle, substantially parallel with the lateral edge BL2.

A plurality of electrical feed-through connectors such as those shown in FIG. 12 are so disposed that they pass through the central part PCFD and the lateral edge BLD2. The box B0 is closed on the one hand by a first cover COUV1 extending between the intermediate edge BIN and the edges BL1 and BL2, forming an L. It is closed on the other by a second cover COUV2 disposed on the other side of the central part PCF2 between the lateral edges BL1 and BL2. Therefore, there are in the box B two spaces situated one on either side of the central part PCFD of the bottom and they are adapted to receive the hybrid components.

The outer face of the wall shown in FIG. 12 here corresponds effectively to the outer face of the box. Here, the various pins project from the inside face of the wall by a length equal to about 1.5 mm. These pins are intended to provide a supply of electricity to the various components contained in the box.

The material which constitutes the bottom of the box comprises an aluminium alloy referred to as "alloy 5086". The material constituting the two covers of the box, on the other hand, is a so-called "4047" aluminium alloy, in accordance with French standards. It consists of approx. 12% silicon and approx. 88% aluminium.

The vitreous material sealing each pin to the wall consists of phosphate glass, the various components of which and their range of quantity as well as the ranges of dilatometric softening temperature and expansion coefficient have been defined hereinabove. In this embodiment, the vitreous material comprises approx. 38.35% by moles of $Na_2O$, 9.59% by moles of BaO, 0.96% by moles of $Al_2O_3$, 46.98% by moles of $P_2O_5$ and 4.12% by moles of AlN.

As a crystallisation modifying agent, it may likewise contain platinum in an effective quantity which is less than 0.5% by moles.

This sealed vitreous material likewise contains the first metallic oxide (alumina) situated in the vicinity of the wall in an effective quantity of between about 0.5% by weight and approx. 0.8% by weight.

Likewise, the sealed vitreous material comprises in the vicinity of the pin (copper-beryllium alloy) the second metallic oxide (nickel oxide) in an effective quantity of between about 0.6% by weight and approx. 1.5% by weight.

These effective quantities of metallic oxides make it possible to obtain what is referred to as an "hermetic" seal. However, generally speaking, a vitreous material which is directly sealed on the aluminium will comprise a quantity of alumina which is at least equal to 0.2% by weight. The maximum quantity will preferably be around 10% by weight.

In order particularly to ensure that the inside of the box enjoys better welding properties while the outside of the box is more resistant to corrosion, the parts of the pin situated outside the sealed vitreous material are gilded. The various covers and the bottom are assembled by means of laser welding, so ensuring the desired degree of sealing-tightness.

The respective alloys of the bottom and of the covers are chosen to permit of such welding. In general two aluminium based materials may be welded by a laser if each of them is copper-free and if at least one of the two contains silicon.

Although the invention can be exploited to full advantage in the embodiments and applications described hereinabove, it has been shown to be even better for certain applications to add to the glass composition used an agent for modifying the working area of the vitreous material.

Indeed, a man skilled in the art usually defines for a vitreous material a range of working temperatures within which the glass exhibits a viscosity which allows it to be deformed while retaining a certain consistency. Thus, a temperature below this working zone is the dilatometric softening temperature while a higher temperature is that for which the vitreous material has a viscosity of $10^4$ Poises.

Well, it seems advantageous for the phosphate glass to comprise an agent adapted to modify its working range which tends to increase this latter. In fact, the wider the working range the less critical it is for the various temperatures used in the stages of the process according to the invention to be precise. This makes a substantial contribution to further improving reproducibility and consequently even more ready industrialisation of the method.

This agent for modifying the working range is, for example, boron trioxide ($B_2O_3$) in a quantity of less than about 15% by moles.

An example of composition of such a vitreous material is as follows:

35% by moles $Na_2O$ 8.75% by moles BaO 0.87% by moles $Al_2O_3$ 42.88% by moles $P_2O_5$ 3.75% by moles AlN 8.75% by moles $B_2O_3$.

Such a vitreous material then has a dilatometric softening temperature of 475° C. approx. and an expansion coefficient of approx. 16 ppm/°C. Its working range is between approx. 475° C. and 550° C. and its melting temperature is about 700° C.

The stages of the glass-aluminium sealing method employing this boron trioxide based vitreous material are similar to those described for a glass composition which contains no boron trioxide.

However, differences exist especially with regard to the temperatures at which certain stages of the method are performed.

In the ensuing text, the references used to describe these modified stages are those which were previously used.

For production of the basic powder (operation 10), 42.4 g sodium carbonate ($Na_2CO_3$), 19.74 g barium carbonate ($BaCo_3$), 1.02 g alumina ($Al_2O_3$), 112.73 g ammonium dihyrogenophosphate ($NH_4PO_4$) 6.96 g boron trioxide ($B_2O_3$) and 1.76 g aluminium nitride (AlN) are used.

In the stage concerned with obtaining the continuous body CC, firing of the crushed material BRO (operation 14) which makes it possible to obtain the vitreous substance SV included raising the temperature in about one hour at the rate of 1100° C. per hour, followed by a levelling off at 1100° C. for two hours and finally a drop in temperature over about 30 mins. until a temperature of approx. 850° C. is reached.

The stage involving sintering of the vitreous material (reference 3) is carried out in a PYREX cupel according to temperature steps of 20° C. per min. until the temperature of 470° C. is reached.

The sealing stage comprises firstly a rise in temperature in steps of 12° C. per min. (operation 700) and then a levelling out at a firing temperature equal to 525° C. for 15 mins. (operation 701) and then a drop in temperature from this levelling-out, in steps of 12° C. per min. (operation 702).

The invention is not confined to the embodiments and applications described but embraces all possible variations thereof, particularly the following:

it is quite possible for the pin to replaced in other applications by some other metallic element, at least;

the presence of the first and second metallic oxides is only necessary at the sealing stage. Therefore, it is quite feasible to carry out partial oxidations of the metallic element and of the seating but only in the effective zones;

it is likewise possible in certain applications requiring only a direct "pin-glass" seal, without the mechanical strength and sealing-tightness being important factors, to carry out this seal without the presence of any metallic oxide between the pin and the vitreous material. The stability of the pin would then be simply ensured by the shrinkage the glass during firing;

in stage 3, it is possible to replace the rod of the pressing tool used for shaping the central passage in the sleeve by the pin itself. Thus, in this case, after pressing an insert is obtained which is composed of the sleeve on the periphery and the pin in the centre and which, after elimination of the binder and sintering becomes an element which is ready to be inserted into the passage in the wall. This alternative embodiment makes it possible to limit the various centring and positioning tools previously used. Of course, the second metallic oxide will have been deposited on the pin before the single element is formed.

It is likewise possible to imagine that the sleeve of such an insert which is obtained after pressing is, after the binder has been eliminated, sintered at a temperature above the previously indicated sintering temperature in order further to enhance the cohesion.

Described hereinabove is the pin gilding stage following the sealing stage. However, it is quite feasible for this gilding stage to be carried out at the time the pin is being prepared and therefore prior to sealing. This gilding would then be partial and would be situated on the parts which are intended not to be sealed in the passage. A man skilled in the art would then use a gold which is resistant to the dilatometric softening temperature of the vitreous material. Such partial gilding could be carried out prior to sealing on a sintered insert (sleeve and pin) such as that mentioned hereinabove.

Of course, it is possible to add to the vitreous material both the one and the other of the crystallisation modifying agents mentioned hereinabove.

Described hereinabove as a particular application of the invention is the preparation of an electrical feed-through connector which passes through an element of a macrohybrid box. However, this type of direct seal of a vitreous material according to the invention an an aluminium based material could equally well be used for other applications or objects. For example, one could envisage the insert comprising only the vitreous material.

Of course, certain of the means described hereinabove may be omitted from those embodiments where they serve no purpose. This may be the case, for example, with the crystallisation modifying agents and/or the agent for modifying the working range.

What is claimed is:

1. A method of implanting at least one insert into at least one opening in a body of aluminum, or aluminum alloy comprising:

a) providing a body of aluminum or aluminum alloy having at least one opening therein, and coating at least a selected portion of said opening in said body with a coating of aluminum oxide of a thickness of 0.5 to 10 microns;

b) providing an insert sintered at least on its periphery which can be inserted into the opening, said sintered periphery comprising sintered phosphate glass powder containing oxygen atoms;

c) inserting said insert into the opening; and d) heating said insert to a firing temperature greater than the dilatometric softening temperature of said phosphate glass powder with the oxygen atoms of the phosphate glass powder interpenetrating with the aluminum oxide coating hermetically sealing the insert to the body.

2. A method according to claim 1, wherein a binder is added to said phosphate glass powder prior to being sintered.

3. A method according to claim 1, wherein the phosphate glass powder for said insert is prepared as follows:

i) preparing the shape of phosphate glass powder;

ii) molding the phosphate glass powder with a binder; and iii) eliminating the binder.

4. A method according to claim 3, wherein the binder comprises a polycarbonated compound having a chain length of at least 1500 atoms and at most 6000 atoms.

5. A method according to claim 4, wherein the polycarbonated compound is polyethylene glycol 4000 in a quantity of 3% by weight.

6. A method according to claim 1, wherein said sintered phosphate glass powder for said insert has been sintered at about the dilatometric softening point of the phosphate glass powder.

7. A method according to claim 1, wherein the granular size of the phosphate glass powder to be sintered is in excess of 5 microns.

8. A method according to claim 1, wherein the granular size of the phosphate glass powder to be sintered is between about 75 and 106 microns.

9. A method according to claim 1, wherein the phosphate glass powder comprises between approximately 20% and approximately 50% by moles $Na_2O$, between approximately 5% and approximately 30% by moles BaO, between approximately 0.5% and approximately 3% by moles $Al_2O_3$, and between approximately 40% and 60% by moles $P_2O_5$.

10. A method according to claim 1, wherein the phosphate glass powder comprises approximately 38.35% by moles $Na_2O$, approximately 9.59% by moles BaO, approximately 0.96% by moles $Al_2O_3$, 4.12% by moles of AlN and approximately 42.88% by moles $P_2O_5$.

11. A method according to claim 1, wherein the phosphate glass powder comprises 35% by moles $Na_2O$, 8.75% by moles BaO, 0.87% by moles $Al_2O_3$, 3.75% by moles of AlN, 8.75% by moles of $B_2O$ and 42.88% by moles $P_2O_5$.

12. A method according to claim 1, wherein the phosphate glass powder has added to it an effective quantity of a crystallization modifying agent.

13. A method according to claim 12, wherein the crystallization modifying agent comprises aluminum nitride in a quantity of less than 7% by moles.

14. A method according to claim 12, wherein the crystallization modifying agent comprises aluminum nitride in a quantity of approximately 4.12% by moles.

15. A method according to claim 12, wherein the crystallization modifying agent comprises aluminum nitride in a quantity of approximately 3.75% by moles.

16. A method according to claim 12, wherein the crystallization modifying agent comprises platinum in a quantity of less than 0.5% of moles.

17. A method according to claim 16, wherein the platinum is added as platinum tetrachloride in an amount less than 0.5% by moles.

18. A method according to claim 1, wherein the phosphate glass powder has added to it an effective quantity of an agent for modifying the temperature range at which it may be used.

19. A method according to claim 18, characterized in that the said agent comprises boron trioxide in a quantity of less than 15% moles.

20. A method according to claim 19, wherein the amount of boron trioxide is 8.75% by moles.

21. A method according to claim 1, wherein the phosphate glass powder has a dilatometric softening temperature of between approximately 300° C. and approximately 550° C. and an expansion coefficient between approximately 10 and approximately 25 ppm/°C.

22. A method according to claim 21, wherein the phosphate glass powder comprises approximately 38.35% by moles $Na_2O$, approximately 9.59% by moles BaO, approximately 0.96% by moles $Al_2O_3$, 4.12% by moles of AlN and approximately 46.98% by moles $P_2O_5$, and the dilatometric softening temperature is approximately 330° C. and the expansion coefficient is approximately 20 ppm/°C.

23. A method according to claim 1, wherein the phosphate glass powder is sintered at about 335° C.

24. A method according to claim 1, wherein the phosphate glass powder comprises 35% by moles $Na_2O$, 8.75% by moles BaO, 0.87% by moles $Al_2O_3$, 3.75% by moles of AlN, 8.75% by moles of $B_2O_3$ and 42.88 by moles $P_2O_5$, and the dilatometric softening temperature of the phosphate glass is approximately 475° C. and the coefficient of expansion of the phosphate glass is approximately 16 ppm/°C.

25. A method according to claim 1, further comprising producing the coating of aluminum oxide by chromic anodic oxidation.

26. A method according to claim 1, wherein the thickness of the aluminum oxide coating is between approximately 1 micron and approximately 1.5 micron.

27. A method according to claim 1, wherein the insert of step (b) comprises a metallic element inserted into a sintered sleeve.

28. A method according to claim 27, wherein the aluminum oxide comprises a first metallic oxide and wherein the insert is heated to its firing temperature in the presence of an effective quantity of a second metallic oxide between the sleeve and the metallic element.

29. A method according to claim 27, in which the metallic element is a pin traversing the sleeve from end to end which makes it possible to provide an electrical feed-through connector.

30. A method according to claim 29 wherein portion of said pin extends outside said sleeve, further comprising gilding the portion of the pin outside the sleeve.

31. A method according to claim 27, wherein a metallic element is machined to a desired shape and a coating is applied to at least a portion of a metallic element which is intended to be situated inside the sleeve, said coating comprising a metallic oxide.

32. A method according to claim 31, further comprising:

depositing a coating of a filler metal on said portion of the metallic element; and oxidizing the filler metal in order to form a second metallic oxide.

33. A method according to claim 32, wherein said aluminum oxide comprises a first metallic oxide, the filler metal is nickel, and the coating of nickel deposited on the metallic element is of a thickness of approximately 5 microns, further comprising heating the insert to firing temperature in the presence of said second metallic oxide between the sleeve and the metallic element, the second metallic oxide being a coating of nickel oxide between approximately 2 microns and approximately 5 microns in thickness.

34. A method according to claim 31, wherein the said sintered sleeve is inserted into the opening in the body and the metallic element is inserted into the sintered sleeve.

35. A method according to claim 31, wherein said sleeve comprises a phosphate glass sleeve said sleeve being produced by a process comprising providing a mold having a desired shape, molding the phosphate glass sleeve by pressing phosphate glass powder blended with binder into the mold and thereafter eliminating the binder, placing the metallic element in said mold to shape a passageway in the sleeve and thereafter fitting the sleeve around the metallic element.

36. A method according to claim 35, wherein the insert is heated to the firing temperature in a neutral atmosphere according to a selected temperature profile.

37. A method according to claim 36, wherein the firing temperature is approximately 450° C.

38. A method according to claim 36 wherein the firing temperature is approximately 525° C.

39. A method according to claim 27, wherein the metallic element comprises a material having a coefficient of expansion of between approximately 15 and approximately 20 ppm/°C.

40. A method according to claim 39, wherein the metallic element comprises a copper-beryllium alloy.

41. A method according to claim 27, wherein said aluminum oxide comprises a first metallic oxide, and further comprising heating the insert to the firing temperature in the presence of a second metallic oxide between the sleeve and the metallic element and said second metallic oxide comprises a coating of nickel oxide on said metallic element.

42. A method according to claim 41, wherein the coating of nickel oxide is between approximately 2 microns and approximately 5 microns in thickness.

43. A method according to claim 1, wherein the opening is a hole extending through the body.

44. A method according to claim 1, wherein after the insert is heated to the firing temperature, the phosphate glass powder is annealed.

45. A method according to claim 1, wherein the body comprises aluminum alloy "5086".

46. A method according to claim 1, in which the body of aluminum or aluminum alloy is a structural element of a device containing at least one electronic circuit.

47. A method according to claim 1 wherein the body of aluminum or aluminum alloy is a structural element of a device containing at least one electronic circuit and the device comprises a bottom and at least one cover of an aluminum based material which is free from copper and of which at least one of said bottom and cover contains silicon, further comprising welding the cover to the bottom by laser welding.

48. A method of implanting at least one insert into an opening in a body of aluminum or aluminum alloy, said opening having an inner surface, comprising:

providing a body of aluminum or aluminum alloy having at least one opening therein;

oxidizing the inner surface of said opening in said body to produce a coating of aluminum oxide of a thickness of 0.5 to 10 microns;

preparing an insert of powdered phosphate glass material having a thermal-expansion coefficient between about 10 ppm/°C. and about 25 ppm/°C. and which contains oxygen atoms and is sintered on at least the outer surface thereof;

inserting said phosphate glass insert into said opening in said body; and heating said insert to a firing temperature greater than the dilatometric softening temperature of said powdered phosphate glass to interpenetrate oxygen atoms in the aluminum oxide coating with the oxygen atoms of the phosphate glass to hermetically seal the insert to body.

49. A method according to claim 48, wherein the entire insert is sintered.

50. A method according to claim 48 wherein said phosphate glass insert has a dilotometric softening temperature of between 300° C. and about 550° C. and an expansion coefficient between about 10 and about 25 ppm/°C.

51. A method according to claim 48 wherein the coating of aluminum oxide has a thickness of 0.5 to about 1.5 microns.

52. A method according to claim 48 wherein said phosphate glass for said insert additionally contains a volatizable binder, and said preparing further comprises pressing said phosphate glass containing said binder to form a shape and heating the insert to a temperature sufficient to sinter at least the outer surface of the insert.

53. A method according to claim 52 wherein said binder comprises a polycarbonated compound.

54. A method according to claim 52 wherein said binder is removed by oven drying prior to said sintering of at least the outer surface of the insert.

55. A method according to claim 49 wherein the phosphate glass for said insert includes a crystallization modifying agent comprising aluminum nitride in an amount less than 7% by moles.

56. A method according to claim 48 wherein the phosphate glass for said insert includes a crystallization modifying agent comprising platinum in an amount less than 0.5% by moles.

57. A method according to claim 48 wherein the phosphate glass for said insert includes an agent for modifying the temperature range in which it can be used.

58. A method according to claim 48 wherein the phosphate glass for said insert contains $B_2O_3$ in an amount less than 15% by moles.

59. A method according to claim 48 wherein the phosphate glass for said insert additionally contains at least one material selected from the group consisting of aluminum nitride in an amount less than 7% by moles, platinum in an amount less than 0.5% by moles, $Al_2O_3$, $B_2O_3$ in an amount less than 15% by moles, $Na_2CO_3$, $BaC_3$, $NH_4H_2PO_4$, and platinum tetrachloride.

60. A method according to claim 48 wherein the phosphate glass for said insert comprises 35% by moles $Na_2O$, 8.75% by moles BaO, 0.87% by mole $Al_2O_3$, 42.88% by moles $P_2O_5$, 3.75% by moles AlN and 8.75% by moles $B_2O_3$.

61. A method according to claim 48 in which the body is a structural element of a box containing at least one electronic circuit.

62. A method according to claim 47 or 48 wherein said sintered phosphate glass powder comprises approximately 20% to 50% by moles of $Na_2O$, approximately 5% to 30% by moles of BaO, approximately 0.5% to 3% by moles of $Al_2O_3$ and approximately 40% to 60% by moles of $P_2O_5$.

63. A method of implanting at least one insert with a metallic element into an opening in a body of aluminum or aluminum alloy comprising:

providing a body of aluminum or aluminum alloy having at least one opening therein, said opening having an inner surface;

oxidizing the inner surface of said opening in said body and coating the oxidized surface in the opening in said body to produce a coating of aluminum oxide of a thickness of 0.5 to 10 microns;

providing an insert in the form of a hollow sleeve of phosphate glass sintered on at least the outer surface thereof, said phosphate glass containing oxygen atoms;

providing a metallic element, a portion of which is sized to be insertable in the hollow sleeve;

depositing a filler metal on the surface of the metallic element on at least the portion thereof which is insertable into said hollow sleeve;

oxidizing the surface of said filler metal;

inserting said metallic element into said sleeve and inserting said sleeve into said opening in said body; and heating said sleeve and metallic element to a firing temperature greater than the dilatometric softening temperature of said phosphate glass so that oxygen atoms of said phosphate glass interpenetrate with the oxygen atoms in the aluminum oxide coating to hermetically seal the sleeve to the body and the metallic element to the sleeve.

64. A method according to claim 63 wherein the inner surface of the body surrounding the opening is oxidized to produce a coating of aluminum oxide of a thickness of 0.5 to about 1.5 microns.

65. A method according to claim 63 wherein the phosphate glass additionally contains a crystallization modifying agent comprising aluminum nitride in an amount less than 7% by moles.

66. A method according to claim 63 wherein the phosphate glass additionally contains a crystallization modifying agent comprising platinum in an amount less than 0.5% by moles.

67. A method according to claim 63 wherein the phosphate glass additionally contains an agent for modifying the temperature range in which it can be used.

68. A method according to claim 63 wherein the phosphate glass additionally contains $B_2O_3$ in an amount less than 15% by moles.

69. A method according to claim 63 wherein the phosphate glass comprises 35% by moles $Na_2O$, 8.75% by moles BaO, 0.87% by mole $Al_2O_3$, 42.88% by moles $P_2O_5$, 3.75% by moles AlN and 8.75% by moles $B_2O_3$.

70. A method according to claim 63 wherein the entire insert is sintered.

71. A method according to claim 63 wherein said phosphate glass has a dilatometric softening temperature of between 300° C. and about 550° C. and an expansion coefficient between about 10 and 25 ppm/°C.

72. A method according to claim 63 wherein said metallic element comprises a copper beryllium alloy, said filler metal comprises nickel and the surface of the nickel is oxidized to produce a coating of nickel oxide.

73. A method according to claim 72 wherein said coating of nickel oxide is approximately 2 to 5 microns in thickness.

74. A method according to claim 72 further comprising gilding a portion of said metallic element that is not intended to be inserted into said sleeve.

75. A method according to claim 63 wherein said element is inserted into said sleeve after inserting said sleeve into said body.

76. A method according to claim 63 in which the body is a structural element of a box containing at least one hybrid electronic circuit.

77. A method according to claim 63 wherein said phosphate glass comprises approximately 20% to 50% by moles $Na_2O$, approximately 5% to 30% by moles BaO, approximately 0.5% to 3% by moles $Al_2O_3$ and approximately 40% to 60% by moles $P_2O_5$.

78. A method of implanting at least one insert into an opening in a body of aluminum or aluminum alloy comprising:

providing a body of aluminum or aluminum alloy having at least one opening therein, said opening having an inner surface;

preparing a phosphate glass insert having a thermal expansion coefficient between about 10 ppm/°C. and about 25 ppm/°C., sintered on at least the outer surface thereof;

providing the inner surface of said opening with an aluminum oxide coating have a thickness greater than 0.5 micron;

lodging the insert in said opening; and heating together said body and said insert lodged in said opening to a firing temperature greater than the temperature at which the phosphate glass has a viscosity of about $10^{11.3}$ poises, to seal the insert to the body.

* * * * *